(12) United States Patent
Geleoc et al.

(10) Patent No.: US 12,278,082 B2
(45) Date of Patent: Apr. 15, 2025

(54) PULSED GENERATOR OF ELECTRICALLY CHARGED PARTICLES AND METHOD FOR USING A PULSED GENERATOR OF ELECTRICALLY CHARGED PARTICLES

(71) Applicant: COMMISSARIAT À L'ÉNERGIE ATOMIQUE ET AUX ÉNERGIES ALTERNATIVES, Paris (FR)

(72) Inventors: Marie Geleoc, Gif sur Yvette (FR); Jean-Philippe Renault, Gif sur Yvette (FR); Thomas Oksenhendler, Gometz le Chatel (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 391 days.

(21) Appl. No.: 17/623,941

(22) PCT Filed: Jun. 30, 2020

(86) PCT No.: PCT/EP2020/068427
§ 371 (c)(1),
(2) Date: Dec. 30, 2021

(87) PCT Pub. No.: WO2021/001383
PCT Pub. Date: Jan. 7, 2021

(65) Prior Publication Data
US 2022/0367139 A1 Nov. 17, 2022

(30) Foreign Application Priority Data
Jul. 2, 2019 (FR) ...................................... 1907324

(51) Int. Cl.
*H01J 37/073* (2006.01)
*H01J 3/02* (2006.01)

(52) U.S. Cl.
CPC ............ *H01J 37/073* (2013.01); *H01J 3/021* (2013.01); *H01J 2237/06333* (2013.01)

(58) Field of Classification Search
CPC .................. H01J 37/0763; H01J 3/021; H01J 2237/0633
See application file for complete search history.

(56) References Cited

U.S. PATENT DOCUMENTS

| | | | |
|---|---|---|---|
| 2,075,379 | A | 3/1937 | Varian |
| 4,703,228 | A | 10/1987 | West |
| 5,969,349 | A | 10/1999 | Budovich et al. |

FOREIGN PATENT DOCUMENTS

| | | |
|---|---|---|
| CN | 107449792 A | 12/2017 |
| DE | 102 45 052 A1 | 4/2004 |

(Continued)

OTHER PUBLICATIONS

International Search Report as issued in International Patent Application No. PCT/EP2020/068427, dated Dec. 7, 2020.

(Continued)

*Primary Examiner* — Joseph L Williams
(74) *Attorney, Agent, or Firm* — Pillsbury Winthrop Shaw Pittman LLP (57) ABSTRACT

A pulsed generator of electrically charged particles includes a vacuum chamber; wherein the vacuum chamber is configured to maintain an internal operating pressure between 10-6 mbar and atmospheric pressure; the vacuum chamber is configured to accommodate a photocathode and an anode, the photocathode and the anode being separated by an adjustable distance less than or equal to 30 mm; the vacuum chamber includes a window enabling pulsed light to reach firstly a rear face of the photocathode; the anode is arranged downstream of the photocathode and has an orifice suitable for the passage of electrically charged particles; the generator of electrically charged particles includes a system to (Continued)

apply a difference in potential between the photocathode and the anode, the voltage being configured to accelerate the charged particles.

22 Claims, 4 Drawing Sheets

(56) References Cited

FOREIGN PATENT DOCUMENTS

| JP | S58-42136 A | 3/1983 |
|---|---|---|
| JP | H03-238742 A | 10/1991 |
| JP | H05-128990 A | 5/1993 |
| JP | 2018-137231 A | 8/2018 |
| JP | 6401600 B2 | 10/2018 |
| WO | WO 2010/042629 A2 | 4/2010 |

OTHER PUBLICATIONS

Search Report as issued in French Patent Application No. 1907324, dated May 18, 2020.

Siwick, B. J., et al., "Femtosecond electron diffraction studies of strongly driven structural phase transitions," Chemical Physics, vol. 299, Jan. 2004, pp. 285-305.

Wytrykus, D., et al., "Ultrashort pulse electron gun with a MHz repetition rate," Applied Physics B: Laser and Optics, vol. 96, No. 2-3, Jan. 2009, pp. 309-314.

Janzen, A., et al., "A pulsed electron gun for ultrafast electron diffraction at surfaces," Review of Scientific Instruments, vol. 78, No. 1, Jan. 2007, pp. 13906-13906 (7 pages).

Hauri, C. P., et al., "Intrinsic Emittance Reduction of an Electron Beam from Metal Photocathodes," Physical Review Letters, vol. 104, No. 23, Jun. 2010, pp. 234802-1-234802-4.

Nassisi, V., "Electron generation from a metal target induced by an XeCl laser," Nuclear Instruments and Methods in Physical Research A, vol. 340, No. 1, Feb. 1994, pp. 182-185.

Ivri, J., et al., "Photoemission from U and Mg using a pulsed XeCl laser," Applied Physics Letters, vol. 62, No. 12, Mar. 1993, pp. 1338-1340.

Baum, P., "On the physics of ultrashort single-electron pulses for time-resolved microscopy and diffraction," Chemical Physics, vol. 423, (2013), pp. 55-61.

Dwyer, J. R., et al., "Femtosecond electron diffraction: 'making the molecular movie,'" Philosophical Transactions of the Royal Society A, vol. 364, (2006), pp. 741-778.

Liedtke, S., et al., "Medium Vacuum Electron Emitter as Soft Atmospheric Pressure Chemical Ionization Source for Organic Molecules," Analytical Chemistry, vol. 88, (2016), pp. 5003-5008.

PULSED GENERATOR OF ELECTRICALLY CHARGED PARTICLES AND METHOD FOR USING A PULSED GENERATOR OF ELECTRICALLY CHARGED PARTICLES

CROSS-REFERENCE TO RELATED APPLICATIONS

This application is the U.S. National Stage of PCT/EP2020/068427, filed Jun. 30, 2020, which in turn claims priority to French patent application number 1907324 filed Jul. 2, 2019. The content of these applications are incorporated herein by reference in their entirety.

TECHNICAL FIELD OF THE INVENTION

The invention pertains to the field of generators of electrically charged particles for chemical, physical-chemical or biological analyses. A subject matter of the invention is a pulsed generator of electrically charged particles capable of generating packets of particles having a temporal duration less than or equal to 1 nanosecond or even less than or equal to 5 picoseconds according to an embodiment of the invention, or even less than or equal to 100 femtoseconds.

The generator according to the invention is capable of producing packets of electrons or ions. The applications of the device according to the invention concern all fields of electron-matter interaction: characterisations by diffraction (LEED, RHEED, gas phase, nano-objects, UED), physical studies of surfaces, Auger spectroscopy, experiments and ionisation sources (aerosols, mass spectrometry), hardening of materials, irradiations (tests of scintillators, simulation irradiations, micro-manufacturing, biological materials), CND, analysis of contaminants, microscopy, electron induced desorption. Another subject matter of the invention is a method for using the generator of charged particles according to the invention.

TECHNOLOGICAL BACKGROUND OF THE INVENTION

The field of generators of electrons or charged particles, relatively recent, is segmented into several technological families which communicate little with each other and which each have systematic working practices, hardly called into question, and which result from the technological origins of each family of researchers. In each, decades of work and experimentation have led to favouring technical choices representing good compromises, and in this respect never called into question. Thus, each family realises an optimised type of source, but with respect to said compromises or working practices. This leads to technological choices strongly orienting the characteristics of the invented source.

A first family is that of accelerator or high energy physicists. It develops robust and very heavy equipment, of which the dimensions are important. It assumes very high vacuums (pressures less than $10^{-7}$ mbar, and usually ultravacuums with pressures less than $10^{-9}$ mbar). The distances are in decimetres or in metres, or even much more, and the voltages applied to the various electrodes are in tens of kV, or even in MV or in GV. The insulators also are solid and made of proven materials, not always easy to machine.

On synchrotrons, the particles obtained are very energetic, in a continuous stream or in packets of numerous particles, at high repetition rate (300 GHz). These particles are not used, because they do not come out of the ring, but they serve to produce photons. The X-ray free electron laser (XFEL) is a machine that tends to replace synchrotrons and which is also at the disposal of photon users.

On accelerators, the repetition rates are from 25 to 50 MHz on account of the complexity of the events to detect and the operations of the detectors.

The space charge is then high, and Coulomb repulsions between the particles of a same packet require the use of voluminous and powerful compression and focusing systems (such as electrostatic lenses or RF cavities), which greatly lengthen the temporal duration of the packets of particles emitted. In addition, the equipment must cope with a generally severe radiative environment. In this family, electron guns may be pulsed but never in mono-electron regime (i.e. several electrons per packet) because high current intensities are required.

For example, the document "A pulsed electron gun for ultrafast electron diffraction at surfaces" of A. Janzen et al. published in "Review of Scientific Instruments" N. 78 in 2007 discloses an electron gun for the analysis of surfaces by electron beams. This device makes it possible to maintain the ultravacuum necessary for the targeted application. In this gun, the cathode and the anode are also spaced apart as much as possible so as to minimise the risk of electrical breakdown and the focusing of the beam of electrons is carried out using electrostatic lenses.

The document "Intrinsic Emittance Reduction of an Electron Beam from Metal Photocathodes" of C. P. Hauri et al. published in "Physical Review Letters" N. 104 in 2010 discloses the use of different metal conversion targets such as Mo, Nb or Al normally used in high energy physics. However, this document exclusively refers to devices of large size.

The second family is that of optical physicists. It obviously uses a primary laser source and a conversion target, normally metal or semiconductor, but also plasma. It is often pulsed, at a recurrence rate from 10 Hz to several MHz, but still fixed. The embodiments strive to obtain packets of particles significantly smaller than for the first family, in order to reduce the space charge. For this family, the main stated objective is the race to obtain the ultimate duration of the packet of particles (from one hundred or so attoseconds to one hundred or so femtoseconds), without consideration for the degree of vacuum, simplicity or comfort of use. The energies involved may be lower than those of the first family, but the targeted beam energies are generally from 30 keV to 200 MeV. In this family, the electron guns may be pulsed in mono-electron regime but not necessarily (they may deliver packets of several tens of thousands of electrons, like the 1st family), the distances are in decimetres or in metres and a high vacuum or ultravacuum type vacuum is necessary.

For example, the document "On the physics of ultrashort single-electron pulses for time-resolved microscopy and diffraction" of P. Baum published in "Chemical Physics" in 2013 discloses methods for reducing the duration of the packets of electrons, notably by reducing the number of particles composing each packet. However, these methods are only applicable to devices of large size and in strict conditions of use.

The document "Ultrashort pulse electron gun with a MHz repetition rate" of D. Wytrykus et al. published in Applied Physics B in 2009 describes an electron gun generating packets of particles at a frequency of 2.7 MHz. These packets may comprise a very low number of electrons. However, the energy dispersion of the electrons generated is great with a $\Delta E/E$ ratio of the order of 0.12 eV. Furthermore, the system requires a large distance between the photocathode and the sample of the order of 300 mm, which greatly limits the compactness of the device. Furthermore, the temporal duration of the packets of electrons is not measured and only a theoretical value is given.

The third technological family is that of chemical physicists. They strive to produce particles sufficiently energetic to ionise matter, but do not master the primary source. It aims to place the sample as close as possible to the production of particles and does not necessarily seek a high vacuum or ultravacuum for its applications. The instruments thus developed have low temporal resolutions and poorly defined energies. When these two parameters become important for studies, physical chemists have to resort to instruments of the first family.

For example, the document "Femtosecond electron diffraction: 'making the molecular movie'" of J. R. Dwyer et al. published in Philosophical Transactions of the Royal Society A in 2006 provides a review of the generation of femtosecond packets of electrons, in direct link with the diffraction of femtosecond electrons and applications under ultravacuum. This document further teaches that at the present time there does not exist a detection system of sufficient resolution to monitor the new types of packets of electrons produced.

The document "Medium Vacuum Electron Emitter as Soft Atmospheric Pressure Chemical Ionization Source for Organic Molecules" of S. Liedtke et al. describes a source of packets of electrons having high internal operating pressure. However, this device uses a source of electrons by heating a cathode or thermo-ionic emission. This comprises a poor temporal resolution and a high temperature of use, which is not compatible with fragile or liquid samples.

A fourth technological family is that of electron microscopy physicists. It is possible to illustrate it by the document WO 2010/042629 A2 which aims to make a thermo-ionic source and a source of photons that modulates the emission of the 1st source cooperate in an electron microscope. The document DE 10245052 A1 relates to an electron microscope but of which the source of electrons is produced according to the techniques of the second family with a stream of packets of electrons chopped in an attosecond manner by interaction with an ultra-rapid laser. The assembly is under ultravacuum with electrostatic focusing lenses.

The applicant has also developed an electron gun being able to generate packets of particles by photoelectric emission. This device, called LUBIOL, has a vacuum chamber with a very low operating pressure of the order of $10^{-7}$ mbar. The packets of electrons comprise a high number of particles and of the order of $10^3$. The kinetic energy of the electrons is of the order of the keV with a repetition rate of the order of the kHz. A system of electrostatic lenses is used to maintain these characteristics of the beam of electrons at the level of the sample. This system has a certain number of drawbacks, notably the impossibility of being free of high vacuum, i.e. to increase the operating pressure, the impossibility of extracting the beam in the presence of a gaseous atmosphere, the impossibility of working with fragile or liquid or desorbent samples, the impossibility of reducing the dimensions of the system and the impossibility of obtaining a robust and simple to use instrument.

More generally, generators of electrically charged particles of the prior art have constraints which prevent their use for the analysis of certain samples. For example, devices that require a high vacuum do not enable the analysis of biological, liquid or desorbent samples. In addition, systems that enable high operating pressure and which are thus compatible with fragile samples, have low temporal and energy resolution.

Further, most generators of electrically charged particles known to those skilled in the art use very high electron acceleration voltages. This leads to high energy consumption. In addition, the distance between the cathode or photocathode and anode must be increased considerably to reduce the risk of electrical breakdown. Rapid pulsed generators of electrically charged particles of low bulk thus do not exist.

To resolve at least partially these technical problems, the invention aims to realise an ultrarapid pulsed source of electrically charged particles that is portative, thus having dimensions and an energy consumption as low as possible, and which has a temporal resolution of the order of the picosecond, while destroying as little as possible fragile samples, such as liquid or biological samples.

SUMMARY OF THE INVENTION

To this end, the invention pertains to a pulsed generator of electrically charged particles comprising:
  a vacuum chamber;
said generator being characterised in that:
  the vacuum chamber is configured to maintain an internal operating pressure comprised between $10^{-6}$ mbar and atmospheric pressure;
  the vacuum chamber is configured to accommodate a photocathode and an anode, the photocathode and the anode being separated by an adjustable distance less than or equal to 30 mm preferably less than or equal to 20 mm;
  the vacuum chamber comprises an optical window enabling pulsed light to reach firstly a rear face of the photocathode;
  the anode is arranged downstream of the photocathode and has an orifice suitable for the passage of the electrically charged particles;
  said pulsed generator of electrically charged particles comprises means for applying a difference in potential between the photocathode and the anode, said difference in potential being configured to accelerate the charged particles.

Electrically charged particles is taken to mean electrons or ions intended for the chemical, physical-chemical or biological analysis of a sample to be characterised.

Upstream and downstream are taken to mean the position of a part with respect to the direction of a light beam emitted by a pulsed light source. In the same way, the front of a part is the side where the light beam arrives and the rear the other side.

According to an embodiment, the generator initially produces electrons which are optionally converted into ions by interaction with a suitable medium.

Advantageously, the generator according to the invention makes it possible to produce packets of charged particles having an ultra-short temporal duration, for example less than or equal to 5 picoseconds (ps). According to an embodiment, the generated packets comprise a small number of charged particles, or even a single charged particle. More in general, the invention makes it possible to obtain packets of charged particles having a temporal duration less than or equal to 1 nanosecond (ns) or even less than or equal to 5 picoseconds according to an embodiment of the invention, or even less than or equal to 100 femtoseconds (fs).

Pulsed light source is taken to mean a light source capable of providing light pulses. According to an embodiment, the pulsed light source is a laser providing pulses of 120 fs duration with a repetition rate of 80 MHz, or of 100 fs duration with a repetition rate of 100 MHz. According to an embodiment, the impulsions have an average wavelength centred on the ultraviolet, for example around 266 nm. According to an embodiment, the light used is an incoherent light, such as a pulsed LED emitting pulses having a temporal duration less than or equal to 70 picoseconds.

Vacuum chamber is taken to mean a device making it possible to maintain an internal pressure less than or equal to atmospheric pressure. The vacuum chamber is further configured to accommodate the elements necessary for the production of the packets of charged particles. According to an embodiment, the vacuum chamber is also configured to accommodate the sample to be characterised. According to another embodiment, the vacuum chamber is provided with a window transparent to the charged particles and placed on the axis of their path coming out of the chamber, and the sample is placed on this path outside of the chamber, preferably as close as possible thereto.

The vacuum chamber is configured to maintain an operating pressure comprised between $10^{-6}$ mbar and atmospheric pressure. In particular, the device according to the invention may be configured to work at an operating pressure comprised between $10^{-3}$ mbar and atmospheric pressure which enables the analyse of fragile, liquid or biological samples. This analysis is carried out using a diagnostics module.

Photocathode is taken to mean an electrode intended to emit electrons by photoelectric effect or photoelectrons. The photoelectrons are obtained by sending pulsed light onto the photocathode. According to an embodiment, the photocathode is metal.

The photocathode is back lit, thus the electrons are emitted on the side downstream of the photocathode and thus in the same direction as the photons of the light beam. The electrons emitted at the outlet of the photocathode are at a very low speed, they are next accelerated by taking the photocathode to a potential of 0 to −30 kV, the anode being at the potential 0.

The orifice present on the anode enables the passage of electrically charged particles and accelerated by the difference in potential applied between the photocathode and anode.

The charged particles coming out of the anode may next be sent onto a sample to be analysed.

Optical window is taken to mean an optical element enabling the pulsed light to reach the photocathode. The optical window may for example comprise a port hole, a passage of optic fibre, a lens or a combination of these elements. The optical window is leak tight, ensuring the maintaining of the working pressure inside the vacuum chamber. In an embodiment, the optical window is directly the input face of the photocathode.

The distance between the cathode and anode is adjustable, which makes it possible to adapt the maximum energy that will be able to be given to the particles without breakdown. Advantageously, this makes it possible to obtain a very compact device as a function of the applied voltage.

For example, the distance L between the photocathode and the anode has a value of 300 µm for a bias voltage of the photocathode of 1 kV, or even 5 kV. Since the voltage is limited to 5 kV, there is no radioactive risk given that the energies of the beams of electrons generated are in the range 1-5 keV. For energies up to 5 keV, one benefits from the exemption on radioprotection (cf. Art. R. 4451-1 and article L. 1333-1 of the French Public Health Code). When this voltage in absolute value is of the order of 10, 20 or 30 kV, this distance is increased by a 2, 4 or 6, or even 10, 20 or 30 proportional factor to avoid electrical breakdown, but the size of the device remains of the order of magnitude of 10 mm, which is much less than the prior art.

Advantageously, the reduction in the distance between the photocathode and the anode allows a higher operating pressure inside the vacuum chamber. The particle generator according to the invention operates with a higher working pressure than particle generators of the prior art. This makes it possible to analyse biological or liquid samples that are not compatible with a vacuum or an ultravacuum.

Advantageously, thanks to a high operating pressure, the sample to be characterised may be placed inside the vacuum chamber and closer to the anode than in the prior art. This makes it possible to reduce the distance between the anode and sample to be analysed and thus to reduce the effects of temporal dispersion of the packets of charged particles. In other words, the generator according to the invention makes it possible to obtain packets of charged particles having very short temporal durations less than 5 picoseconds, or even less than the picosecond.

Advantageously, the generator of charged particles according to the invention thus makes it possible to analyse fragile samples such as liquid or biological samples with very high temporal resolution, which is not possible with devices known to those skilled in the art. In addition, the generator according to the invention has reduced dimensions and low energy consumption.

When the samples to be analysed do not withstand a pressure less than atmospheric pressure, it is possible to resort to the alternative of the invention comprising a window transparent to the charged particles and situated on their path. The sample is then placed against this window while being outside the vacuum chamber. If the sample is liquid, the generator according to the invention may be oriented in such a way that the beam comes out above, the outlet window of the particles then being horizontal.

The window transparent to the charged particles may be absent, and in this case the generator is directly coupled to an existing vacuum chamber.

According to an embodiment, the photocathode comprises an Au film, and a tie film made of Cr or Ti which enables a much longer lifetime without upkeep in degraded vacuum conditions than the photocathodes used by those skilled in the art made of semiconductor material. The invention may use this type of photocathode with an Au film, neglected by those skilled in the art, on account of the deliberate choice of a small number of electrons per pulse, which is compensated by the fact that these pulses are renewed at a high rate.

According to an embodiment, the elements present inside the vacuum chamber are obtained by deposition of thin or ultra-thin films on blades polished to optical quality. This makes it possible to apply electric fields having intensities greater than 30 MV/m while reducing the risk of electrical breakdown.

According to an embodiment, the generator of charged particles according to the invention further comprises means for modifying the direction of the pulsed light beam, so as to modify the point and the angle of attack of the photocathode. In other words, the generator according to the invention makes it possible to modify the focusing point of the light beam and its angle of arrival on the photocathode.

According to an embodiment, the generator according to the invention further comprises a breakdown detector. Advantageously, the breakdown detector makes it possible to determine, for a given electric field, the electrical breakdown pressure. It is thus possible to choose a high working pressure while avoiding electrical breakdown.

It is important to note that, in the usual design of electron guns, it is sought to be outside of the conditions of breakdown with a safety margin, which is why the electrodes are very far apart and the guns have dimensions of several tens of cm. Conversely, the device according to the invention avoids electrical breakdown not by a higher vacuum as in the prior art, but conversely by a not very marked vacuum, or even quasi-inexistant, associated with a breakdown detector constituted of a spark gap adjusted to a voltage slightly less than the breakdown voltage of the device, and giving a warning signal making it possible to move the operating conditions (pressure of the vacuum chamber or anode-cathode distance) away a little from conditions of breakdown.

Advantageously, the device according to the invention makes it possible to generate packets of particles having a temporal duration less than or equal to 1 nanosecond or even less than or equal to 5 picoseconds according to an embodiment of the invention, or even less than or equal to 100 femtoseconds.

In a particular configuration, the photocathode is taken to a negative potential, the anode is at a zero potential, like the sample, it is thus possible to envisage in certain cases to have a zero distance between the anode and the sample, but in general a spacer will be placed between the two so as not to damage the sample, but it may be very thin. It is possible to have the photocathode at zero potential and the anode at a potential >0 but this would be dangerous for the user and for the sample and could induce short-circuits.

The distance between the photocathode and the sample does not play enormously on the temporal resolution (to some several fs) close to conditions of breakdown.

The table below shows, for voltages and photocathode and anode distances, the acceleration field obtained and the durations of packets of electrons obtained at 25 mm from the photocathode, knowing that it is sought to remain around from 3 kV·mm$^{-1}$ to $10^{-5}$ mbar to not have breakdown, around 1.5 kV·mm$^{-1}$ to $10^{-4}$ mbar etc.

TABLE 1

| Voltage (kV) | Photocathode-anode distance | Eacc (Kv · mm$^{-1}$) | Δt |
|---|---|---|---|
| 0.5 | 1 mm | 0.5 | 1.48 ps |
| 1 | 0.3 mm | 3.3 | 222 fs |
| 1 | 0.6 mm | 1.7 | 444 fs |
| 1 | 1 mm | 1 | 740 fs |
| 1 | 1.7 mm | 0.6 | 1.26 ps |
| 3 | 1 mm | 3 | 247 fs |
| 5 | 1.7 mm | 2.9 | 252 fs |
| 10 | 10 mm | 1 | 740 fs |
| 20 | 10 mm | 2 | 370 fs |
| 30 | 10 mm | 3 | 247 fs |

The device according to the invention may also comprise one or more of the following characteristics according to all technically possible combinations thereof:
 the distance between the photocathode and the anode is less than 10 mm;
 the distance between the photocathode and the anode is less than 2 mm;
 the bias voltage of the photocathode is less than or equal in absolute value to 30 kV (preferably comprised between −30 kV and 0 V) so as to obtain packets of electrically charged particles, each packet having a temporal duration less than or equal to 5 ps;
 the bias voltage of the photocathode is less than or equal in absolute value to 10 kV (preferably comprised between −10 kV and 0 V) so as to obtain packets of electrically charged particles, each packet having a temporal duration less than or equal to 5 ps;
 the bias voltage of the photocathode is less than or equal in absolute value to 5 kV (preferably comprised between −5 kV and 0V) and the distance between the photocathode and anode is less than or equal to 1.5 mm, preferably less than or equal to 300 μm;
 the bias voltage of the photocathode is less than or equal in absolute value to 10 kV (preferably comprised between −10 kV and 0V) and the distance between the photocathode and anode is less than or equal to 3 mm, preferably less than or equal to 600 μm;
 the bias voltage of the photocathode is less than or equal in absolute value to 20 kV (preferably comprised between −20 kV and 0V) and the distance between the photocathode and anode is less than or equal to 6 mm, preferably less than or equal to 1.2 mm;
 the bias voltage of the photocathode is less than or equal in absolute value to 30 kV (preferably comprised between −30 kV and 0V) and the distance between the photocathode and anode is less than or equal to 10 mm, preferably less than or equal to 1.8 mm;
 the pulsed light source produces light pulses having a temporal duration less than or equal to 5 ps;
 the generator further comprises a breakdown detector;
 the breakdown detector is placed near to the anode and comprises:
  a substrate made of insulating material with high dielectric constant;
  a ring and a stem made of conductive material taken to the same potential as the anode;
  a stem made of conductive material, said stem being moveable and being able to come closer to the conductive ring;
 the breakdown detector is configured to determine the electrical breakdown pressure under the bias voltage of the photocathode used;
 the sample to be analysed is placed inside or outside the vacuum chamber;
 the pulsed generator comprises a diagnostics module for the analysis of the sample.
 the sample to be analysed is at a distance d2 from the diagnostics module such that 0<d2≤60 mm when the sample is placed outside and d2 is such that 0<d2≤0.7 mm when the sample is placed inside. Thus, several positions of the sample and the diagnostics module are possible:
  the sample with the diagnostics module inside,
  the sample inside with the diagnostics module outside,
  the sample with the diagnostics module outside;
 the generator according to the invention has in the axis of the beam of charged particles a window transparent to said charged particles and making it possible to conserve in the chamber a pressure less than atmospheric pressure;
 the window transparent to the charged particles is a membrane, which is particularly suitable if the sample is of low density such as a gas or if it is a liquid;

the membrane is made of silicon nitride $Si_3N_4$ or graphene $(C)n$ and has a thickness comprised between several nm and several hundreds of nm, typically between 2 and 200 nm;

the photocathode comprises a nanometric metal stack on a substrate of thin optical blade type;

the orifice of the anode is anisotropic and has a first characteristic dimension and a second characteristic dimension, the second characteristic dimension being at least two times greater than the first characteristic dimension;

the two characteristic dimensions are orthogonal to each other and both orthogonal to the axis of the beam of charged particles;

the anisotropic orifice of the anode is slot shaped;

the slot shaped orifice comprises at least two parallel edges, the two parallel edges being at two different electrical potentials.

the generator further comprises another diagnostics module for the determination of the temporal duration of the packets of electrically charged particles;

the breakdown detector is configured to provide a warning signal and/or to stop the generator of particles if the operating pressure inside the vacuum chamber is not low enough to avert the risk of electrical breakdown;

the charged particles are ions and the generator according to the invention further comprises the following elements:
  a gas able to emit positive ions during an electron bombardment;
  at least one anode for focusing the ion beam.

Another subject matter of the invention is a method for using the pulsed generator of charged particles according to the invention.

The method according to the invention makes it possible, according to a first mode of use, to analyse a sample using a pulsed generator of charged particles according to the invention and comprising the following steps:
  placing the sample in the vacuum chamber,
  creating a vacuum in the vacuum chamber between $10^{-6}$ mbar, preferably $10^{-5}$ mbar, and atmospheric pressure;
  placing the pulsed generator of charged particles on a table in front of a pulsed light source;
  positioning a diagnostics module for the analysis of the sample in position downstream of the sample.

According to a first arrangement, the module D' is placed inside the vacuum chamber.

According to a second arrangement, the module D' is placed outside the vacuum chamber.

The method according to the invention makes it possible, according to a second mode of use, to analyse a sample using a pulsed generator of charged particles according to the invention and comprising the following steps:
  creating a vacuum in the vacuum chamber between $10^{-6}$ mbar, preferably $10^{-5}$ mbar, and atmospheric pressure;
  placing the pulsed generator of charged particles on a table in front of a pulsed light source;
  placing the sample in position downstream of the vacuum chamber,
  positioning a diagnostics module for the analysis of the sample in position downstream of the sample.

The adjustment of the internal operating pressure is done using the breakdown detector, the adjustment comprises the determination, for a given electric field, of the operating pressure at the limit of electrical breakdown.

In other words, the method according to the invention makes it possible, for a given electric field, to find the operating pressure at the limit of electrical breakdown.

BRIEF DESCRIPTION OF THE FIGURES

Other characteristics and advantages of the invention will become clear from the description that is given thereof below, for indicative purposes and in no way limiting, with reference to the appended figures.

DETAILED DESCRIPTION

Figure 1:
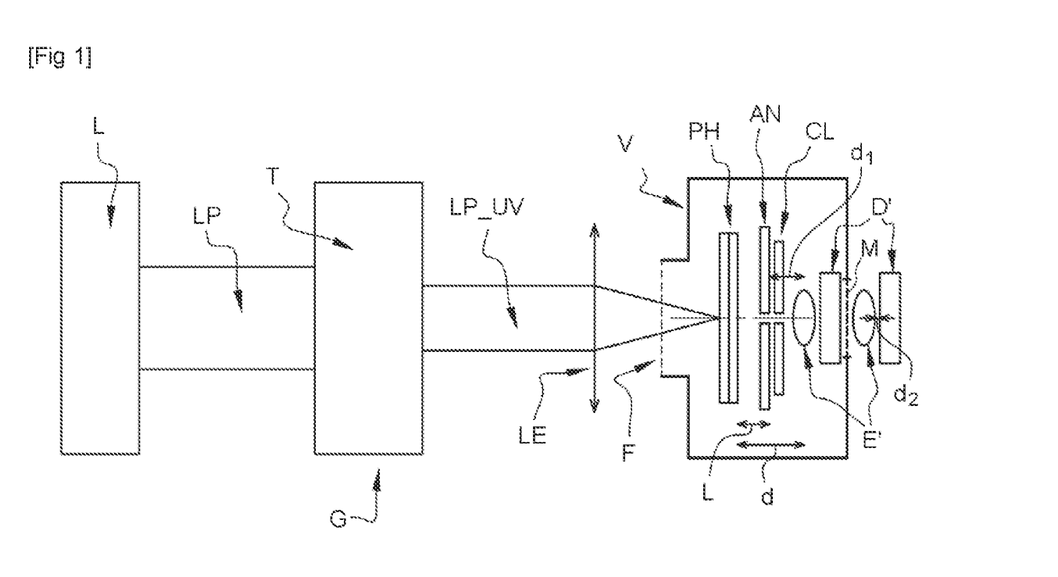
FIG. 1 illustrates an embodiment of the particle generator according to the invention with two possible positions of the sample and the diagnostics module for the analysis of said sample.

FIG. 1 illustrates an embodiment of the generator G of electrically charged particles according to the invention. In the remainder of this document, the generator G will be indiscriminately called generator G of charged particles or Mini Gun. The generator G is illuminated by a pulsed light source L emitting light pulses LP. The light pulses LP are sent to a tripler device T making it possible to obtain light pulses LP_UV having a wavelength smaller than the pulses LP. The beam LP_UV is next sent onto a photocathode PH. According to the embodiment illustrated in FIG. 1, the beam LP_UV is focused using a lens so as to be concentrated on a precise point of the photocathode PH.

The photocathode PH being back-lit, the electrons are emitted in the same direction as the photons of the light beam, which makes it possible in certain cases to cumulate their effects on the sample to be analysed. According to an embodiment, the source is a pulsed source at 1064 nm and a frequency quadrupler system is used to obtain light pulses having higher energy.

According to an embodiment, the generator G further comprises means for modifying the arrival point and the angle of attack of the beam LP_UV on the photocathode.

According to an embodiment, the pulsed light source LP emits pulses having a central wavelength in the infrared. For example, the pulses have a central wavelength of 800 nm with a repetition rate of 80 MHz. The temporal duration of the pulses is of the order of several tens of fs. According to an embodiment, the light source L is a pulsed laser such as a femtosecond laser. Alternatively, the triggering laser is a pulsed UV, VIS or IR laser, or any other UV, VIS or IR pulsed light source.

In a manner known to those skilled in the art, the tripler T makes it possible to obtain light pulses LP_UV having a central wavelength around three times smaller than the wavelengths of the pulses emitted by the source L. For example, the light pulses coming from the tripler T have a central wavelength of the order of 266 nm. Advantageously, the light pulses of the beam LP_UV are suitable for generating photoelectrons at the level of the photocathode PH.

The generator of charged particles according to the invention further comprises a vacuum chamber V configured to maintain therein a working pressure comprised between $10^{-6}$ mbar, preferably $10^{-3}$ mbar, and atmospheric pressure. The vacuum chamber V comprises an optical window F enabling the passage of pulses LP_UV intended to be focused on the photocathode PH. The vacuum chamber V has, in the axis of the beam of charged particles, a window M transparent to said charged particles, the window M transparent to the charged particles may for example be a membrane. This window M enables the charged particles to reach the sample E and the diagnostics module D' when these are placed outside the vacuum chamber V. The window M has a thickness comprised between 2 and 200 nm.

According to an embodiment, the photocathode PH is constituted of a nanometric metal stack on a substrate of thin optical blade type, the nature of which is a function of the triggering wavelength and the desired vacuum retention. The surface state of the constituent metal may be smooth or nano-structured. The substrate may be flat or shaped as a function of the desired spatial shaping of the beam.

The generator G according to the invention comprises an anode A positioned at a distance L from the photocathode PH and means for applying an electric field (or difference in potential) between the photocathode and the anode. This electric field is also called electron acceleration field.

The distance L between the photocathode PH and anode AN is adjustable and may be adapted to the voltage chosen. For example, the distance L between the photocathode and the anode has a value of 300 μm for a bias voltage of the photocathode in absolute value of 1 kV, or even 5 kV. When this voltage in absolute value is of the order of 10, 20 or 30 kV, this distance L is increased by a 10, 20 or 30 proportional factor to avoid electrical breakdown, but the size of the device remains of the order of magnitude of the mm which is much smaller than the prior art.

According to an embodiment, the module comprising the photocathode PH and the anode AN is machined, the electrodes not being displaceable. The change of distance L between the electrodes thus takes place by substitution of the module comprising the electrodes, by choosing a module having a distance L suitable for the bias voltage of the photocathode chosen. According to another embodiment, the electrodes are moveable and the distance L is adjusted by moving away or bringing closer the two electrodes without changing module.

According to an embodiment, the distance L between the photocathode PH and anode AN is less than 30 mm preferably 10 mm.

According to an embodiment, the distance L between the photoemissive cathode and the accelerator anode has a numerical value less than $L_{Max(mm)} = 1 + V_{(kV)}$ where V is the acceleration voltage in kV, $L_{Max}$ being in millimetres.

Advantageously, the invention makes it possible to reduce the distance L between the photocathode PH and anode AN while using high operating pressures. This makes it possible to reduce the temporal dispersion of the packets of electrons generated and to obtain packets of electrons with small temporal duration, for example less than or equal to 5 ps.

The anode AN has an orifice or opening to enable the passage of the charged particles accelerated by the electric field applied between the photocathode PH and anode AN.

According to an embodiment, the anode AN has an orifice for the passage of electrons having an anisotropic section in the plane normal to the beam of electrons.

Figure 4:
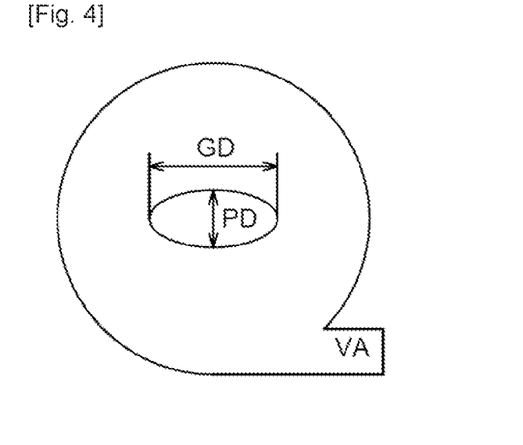
FIG. 4 illustrates a first embodiment of the anode of the particle generator according to the invention.

As illustrated in FIG. 4 in the case of a circular anode, the anisotropic section of the orifice comprises two characteristic dimensions: a smaller diameter PD and a larger diameter GD, perpendicular to each other.

Such an anode enables the use of the beam of electrons without passing through a downstream focusing lens, which would be difficult to implement.

The smaller diameter is substantially smaller than according to the embodiments of the prior art. The larger diameter is greater than or equal to double the smallest diameter.

According to an embodiment, the small diameter is comprised between 100 μm and 2 mm and the large diameter is comprised between 100 μm and 20 mm.

Advantageously, the anisotropic anode AN plays a role of filtering electrons generated out of axis, so as to improve the emittance of the beam at the price of the flow of electrons transmitted. Advantageously, this makes it possible to reduce the number of electrons and to limit the space charge effect which would reduce the temporal resolution of the Mini Gun.

Figure 5:
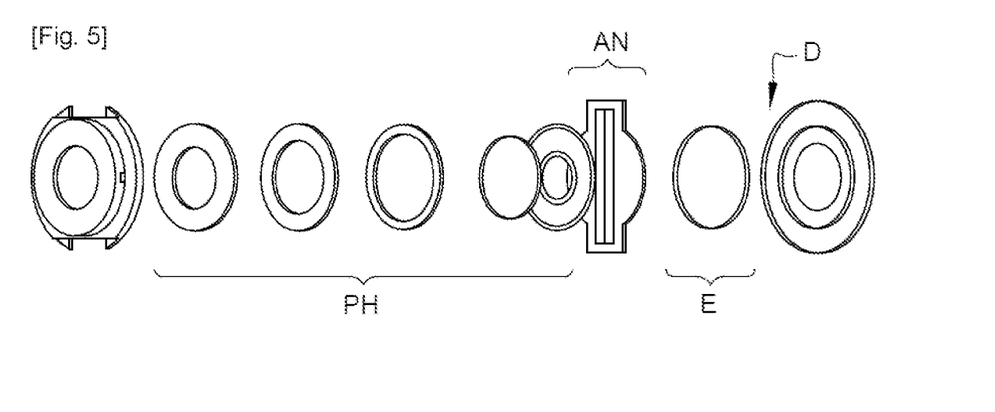
FIG. 5 shows a second embodiment of the anode of the particle generator according to the invention.

According to an alternative, the anode is not like a ring or a pierced plate but a juxtaposition in a same plane of two flat plates facing one another by two parallel lips so as to obtain an orifice for the passage of slot shaped charged particles. This embodiment is illustrated in FIG. 5.

Optionally, the generator G according to the invention further comprises a breakdown detector CL or spark gap.

The detection of a breakdown makes it possible to ensure that, despite a weak vacuum inside the Mini Gun, there will be no degradation of the components, notably of the cathode and the anode. There is no need for a veritable pressure measurement, but simply ensuring that at the working pressure chosen for the inside of the Mini Gun, there is no risk of breakdown. The use of a breakdown detector is counter intuitive for those skilled in the art who would seek to use a means for measuring the pressure inside the vacuum chamber, while adjusting the pressure and voltage to move away as much as possible from conditions of breakdown.

To do so, a spark gap having a disruptive distance less than that between the anode and cathode is placed in the chamber of the Mini Gun, in such a way that a spark is produced on this spark gap. According to an embodiment, the breakdown detector CL or spark gap is constituted of a conductive ring placed opposite a stem, the whole being inserted just after the anode along the direction of propagation of the electrons. This spark gap is increased to the voltage at which it is wished to operate the chamber of the Mini Gun, comprised between 1 and 30 kV, preferably during a phase of initial adjustment for a working campaign. The appearance of a breakdown on the spark gap protects the functional elements, namely cathode and anode, separated by a distance L a little greater than the distance separating the elements of the spark gap. The breakdown detector CL makes it possible, for a chosen working voltage, to come very close to breakdown without all the same exposing the functional components in exploitation mode.

Advantageously, thanks to the breakdown detector or spark gap CL the generator of charged particles according to the invention provides packets of charged particles having a very short temporal duration, while working with a high pressure inside the vacuum chamber. In other words, thanks to the breakdown detector, it is possible to analyse fragile, liquid or biological samples, with a temporal resolution of the order of the picosecond.

It may be seen in FIG. 1 that the sample to be analysed E may be placed both inside or outside the vacuum chamber V. A diagnostics module for the analysis of the sample D' is still placed downstream of the sample to be analysed E. It may be seen in FIG. 1 that when the sample E is placed inside the vacuum chamber V, the diagnostics module D' may be placed inside or outside said chamber V. When the sample to be analysed E is outside the diagnostics module, D' is also outside. The diagnostics module D' is arranged at a distance d2 from the sample E such that 0<d2≤60 mm. It is important that the sample to be analysed is not in contact with the diagnostics module in order to avoid a transfer of charges.

According to an embodiment, the distance d between the photoemissive cathode and the sample is comprised between 1 mm for a bias voltage of the lower photocathode in absolute value of 1 kV, and 30 mm for a bias voltage of the photocathode of the order of 30 kV in absolute value.

Advantageously, a small distance between the anode AN and sample to be analysed E makes it possible to limit the temporal dispersion of the packets of electrons and to obtain high temporal resolution. Thus, when the sample E is inside the chamber V, the sample E to be analysed is at a distance d1 such that 0<d1≤0.7 mm.

Figure 8:
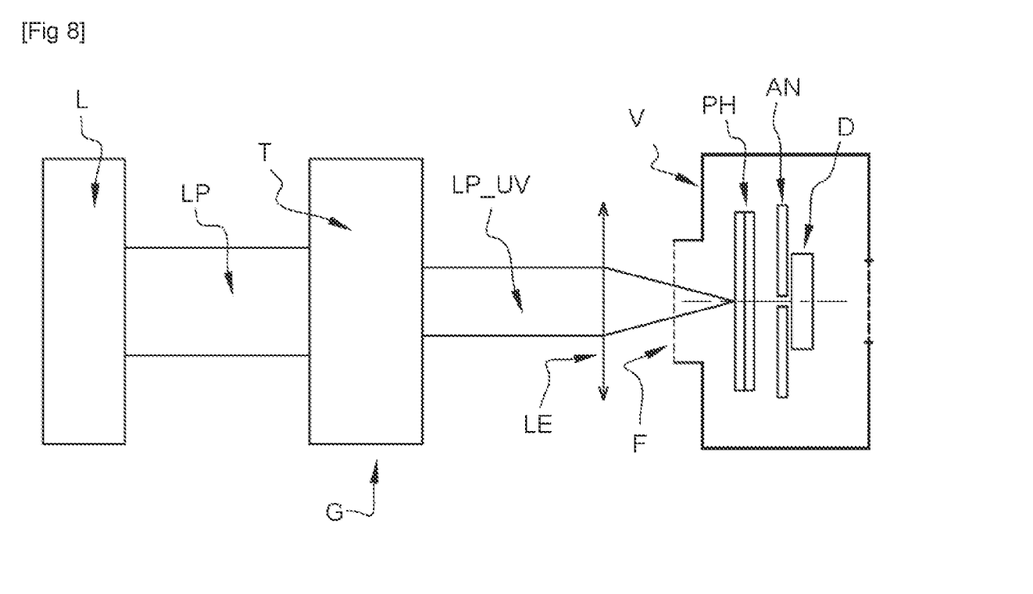
FIG. 8 shows a mode for calibrating the particle generator according to the invention.

As illustrated in FIG. 8, the generator G according to the invention may comprise another diagnostics module D, arranged as near as possible to the anode, for the determination of the temporal duration of the packets of electrons or charged particles, it is used to calibrate the generator as a function of the laser used, then it is removed during sample measurements. This other diagnostics module D may be used with an anisotropic anode having a slot shaped opening.

According to an embodiment, the electrically charged particles are ions of gas. In this case, the following elements are added downstream of the beam of electrons to obtain a generator of ions of gas:
  a gas capable of emitting positive ions during an electron bombardment;
  at least one anode for focusing the ion beam.

Figure 2:
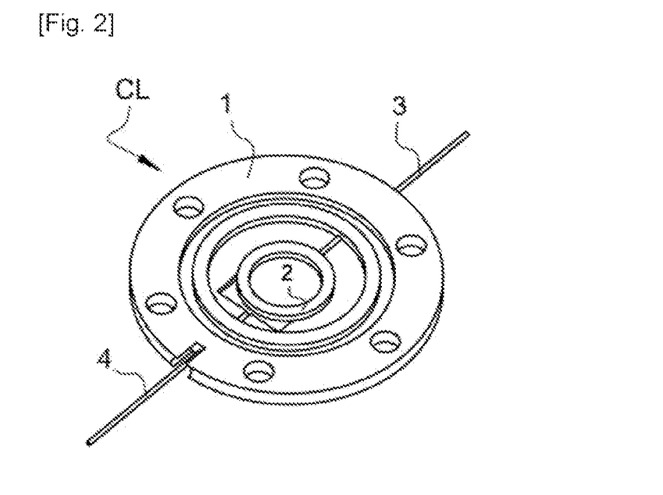
FIG. 2 illustrates an embodiment of the breakdown detector according to the invention.

FIG. 2 illustrates an embodiment of a breakdown detector or spark gap CL according to the invention.

In the usual design of electron guns, it is sought to be outside of the conditions of breakdown with a safety margin, which is why the guns generally have dimensions of several tens of cm. A value of 1.5 kV·mm$^{-1}$ corresponds to the breakdown threshold of a vacuum at $10^{-4}$ mbar, a value of 3 kV·mm$^{-1}$ corresponds to the breakdown threshold of a vacuum at $10^{-5}$ mbar.

Conversely, the Mini Gun comes very close to conditions of breakdown: the device according to the invention works at the limit of breakdown, on the one hand because it is necessary to apply high voltages on reduced dimensions, on the other hand because the insertion of a sufficiently miniaturized pressure gauge for the system is not possible.

Electrical breakdown inside the gun is avoided not by a higher vacuum, as in the prior art, but quite the opposite by a not very marked vacuum, or even quasi-inexistant, associated with a breakdown detector CL comprising a spark gap adjusted to a voltage slightly less than the breakdown voltage of the gun, and giving a warning signal making it possible to move the operating conditions away a little from conditions of breakdown.

The breakdown detector CL according to the invention comprises:
  a substrate 1 made of insulating material with high dielectric constant, for example made of Peek;
  an electrically conductive ring 2 connected to a stem 3, also conductive, the two being electrically connected and taken to the potential of the anode;
  a conductive stem 4 sliding in its boring, able to be displaced radially, for example under the effect of a micrometric screw, not represented.

The end of the stem 4, which can be seen barely sticking out in the central boring, is placed at a distance a little less than the distance of the shortest electrical path between the anode AN and photocathode PH. Since this anode AN and photocathode PH distance varies according to the voltage at which it is chosen to make the chamber of the gun work, the distance between the end of the stem 4 and the ring at the potential of the anode must be adjusted consequently, so as to have the same value or to be very slightly below. According to a preferential alternative, the stem 4 is integral with the cathode PH, such that when the anode AN and photocathode PH distance is adjusted, the distance between the apex of the stem 4 and the ring 2 is modified at the same time and in the same proportions.

According to an embodiment, the anode AN and the photocathode PH are separated by a distance L of 300 μm. The electrical resistance of air at atmospheric pressure is 36 kV cm$^{-1}$ which is equal to 300 μm for a difference in potential of 1080 V. The device according to the invention being able to operate up to 10 kV, this is not sufficient to avoid breakdown, thus the fact of creating the vacuum makes it possible to increase this maximum voltage before the creation of an electric arc which could damage the system and create a risk for the user.

It is important to note that the vacuum is very weak or inexistant according to the needs of the sample to be analysed. This is done by a pumping device, but which is used from time to time, for example before a measurement campaign.

Advantageously, the device according to the invention does not require a heavy and constantly active device like devices working under a vacuum greater than $10^{-5}$ mbar, and often greater than $10^{-7}$ mbar.

Advantageously, thanks to the breakdown detector CL, the exact measurement of the pressure is not necessary for the use of the device according to the invention.

Advantageously, the device according to the invention makes it possible to warn the user or stop the system when the pressure is not low enough and when it can represent a risk of breakdown In order to respond to this function; the system comprises an earth connected to an electronic board. This earth is placed so as to be closer to the anode than the cathode, thanks to a calibrated ring which serves as insulating spacer. The breakdown between the anode and earth will thus occur earlier and it will be possible to process the information upstream of the breakdown of the system.

Figure 3:
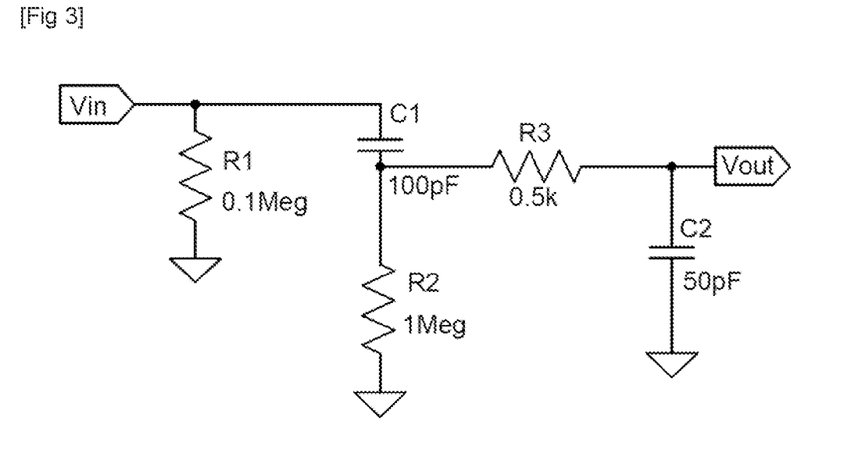
FIG. 3 illustrates an embodiment of the electric circuit of the breakdown detector of the particle generator according to the invention.

The circuit for detecting breakdown, illustrated in FIG. 3, accommodates in "Vin" the voltage of the photocathode PH, while the remainder of the circuit and the anode AN are referenced to earth. At each spark, a pulse is generated on the output "Vout". The signal at the output "Vout" may thus be used to warn the user of the risk of electrical breakdown.

FIGS. 4 and 5, discussed above, illustrate the two embodiments of the anode AN having an anisotropic opening.

Figure 6:
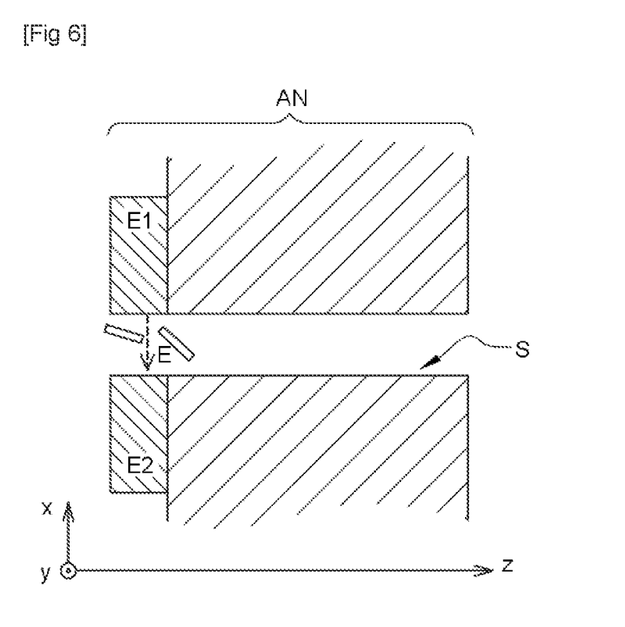
FIG. 6 illustrates a sectional view of the anode, the section passing through the smallest diameter of the anisotropic anode.

FIG. 6 illustrates a sectional view of the anode AN, the section passing through the smallest diameter of the anode AN. According to an embodiment, the anode is deposited on an insulating substrate S made of sapphire of 700 μm thickness, orthogonal to the axis z corresponding to the axis of propagation of the beam of electrons. According to an embodiment, the anode AN is a single and same electrode constituted for example of a conductive film affixed on a holed substrate.

The opening for the passage of the charged particles may be slot shaped, as is illustrated in FIG. 5. In this case, the large diameter GD extends up to the ends of the anode in such a way as to cut it into two distinct elements mechanically connected together by an insulating element. The anode AN then comprises two parallel lips, one subjected to a voltage $U-\Delta v$, and the other to $U+\Delta v$.

According to an embodiment, it is also possible to envisage several parallel slots for several source points in parallel.

According to an embodiment, such a slot shaped anode may be constituted of a conductor affixed on a substrate S, the whole having been cut by an elongated slot along y of very small dimensions along x, with parallel edges. According to this configuration, it is possible to obtain two distinct electrodes taken to a potential of one or more kV compared to the emissive cathode, but electrically insulated from each other. They may also have between them a small difference in potential compared to the voltage of the cathode, but which may be of several tens or hundreds of volts, thus creating an electric field E between their lips. This electric field E can vary over time in synchronism with the arrival of the packets of electrons, in such a way that the two ends of the packet of electrons do not see the same field E. Thus, in the diagram of FIG. 6, the first electron of each packet sees an important field E which deflects it towards the electrode E2, and this field decreases for the following electrons up to a zero field for the final one of the packet. This has the effect of turning the axis of the packet of electrons, and thus to increase its projection perpendicular to the axis of propagation, and to enable a spatial measurement from which a temporal measurement will be deduced. Preferably, the electrodes E1 and E2 constitute a "coplanar microstrip line" of an impedance of 50Ω which allows extremely rapid rising or trailing edges along these electrodes.

In other words, when the anode is constituted of two flat lips facing each other, these two lips spaced apart by a small distance and rigorously constant are taken to different potentials. This is advantageous when the generator G is pulsed with pulses of short duration ps or fs reflected by small packets of electrons. The anode then simultaneously fulfils several functions.

According to an alternative, the constant potentials VE1 and VE2 applied to the electrodes E1 and E2 have a difference $\Delta VE$ that is relatively small but variable over time. The anode then has, in addition to its acceleration function, that of deflector which enables a temporal diagnostic of the beam of electrons. This is the principle of this temporal diagnostic, designated "streaking" or scanning which can be summarised thus: the packet of electrons is made to pass in a small field with 2 elements at a different potential subjected to an electric field oscillating as a function of time, transversal with respect to the direction of propagation of the packet of electrons. Thus, the packet of electrons is going to be deflected as a function of time with respect to the initial axis z of propagation. The duration measurement is indirect, deduced from the spatial dimension of the packet of electrons projected onto a wafer type detector of microchannels and phosphorous screen: the longer the packet is temporally, the larger the image of the packet on the detector. Here the packet of electrons is made to pass in a field of which the dimension is given by the thickness of the blades that constitute the anode.

The fact of placing the voltage on the two lips of the anode makes it possible to obtain, for example for a voltage of +/−20V, a displacement of the beam of 30 μm and 180 μm for +/−100V.

Advantageously, this embodiment enables the integration of a scanning system directly at the level of the anode.

Exemplary embodiment of an anode with integrated scanning system: the electrodes are designed to constitute a 50Ω "coplanar microstrip line". This configuration will make it possible to test the time resolved scanning mode of this device. The anode plate is the most complex part of the device. It is a sapphire substrate of 700 μm cut so as to allow electrodes to come out and split in the middle to allow electrons to pass, for example with a slot of 100 μm. The rear face is optionally thinned in the middle to avoid any contact with the sample plate.

In static mode, without differential voltage on the electrodes of the anode, the beam conserves a reduced dimension less than 20 μm. The dimension of the beam of electrons is greater than the dimension of the beam of incident photons on the photocathode, but of the same order of magnitude. In scanning mode, with voltages on the electrodes of the anode, this size is conserved with a sensitivity of the order of 100 μm/100V i.e. a simulated displacement of 200 μm at the level of the sample for voltages +/−100 V for the electrodes. The maximum deflection depends on the geometry of the slot and is of the order of 1 mm for voltages of +/−500 V. These values are valid for a displacement perpendicular to the slot and measured at 700 μm from the anode, at the level of the sample.

The distance d1 between the anode AN and the sample E to be analysed is small and less than 60 mm preferably $0<d1\leq0.7$ mm. Consequently, it may be advantageous to place the sample E inside the chamber of the generator G of charged particles or outside. It is important that the sample to be analysed is not in contact with the anode in order to avoid a transfer of charges, except in the case where the potential of the anode and the sample are zero.

Advantageously, it is possible to use the Mini Gun in horizontal or vertical position on an optical bench or on any other mounting, given that the incidence of the triggering laser beam may be perfectly mastered. It is then possible to analyse liquid samples with a beam in vertical position.

The use of the system in horizontal position notably offers the possibility of working with a liquid sample: a drop of the sample is positioned on an output interface suitable for the energy of the electrons, for example an ultrathin membrane of $Si_3N_4$ or graphene having a thickness comprised between 2 nm and 200 nm.

In the prior art, the beam of electrons is directed onto a sample placed in a vacuum chamber. Advantageously, the device according to the invention offers the possibility for the sample to remain at atmospheric pressure, since the beam of electrons is made to come out of the mini gun which constitutes a miniaturised vacuum chamber.

An alternative for the study of samples withstanding a vacuum consists in placing the sample directly in the chamber of the Mini Gun, as close as possible to the emission, the detection of the phenomenon to study, for example the scintillation, being able to be carried out by a detector directly placed behind the sample.

The sample may be designed as a module of the Mini Gun, in the same way as the photocathode, the anode or the detector.

Figure 7:
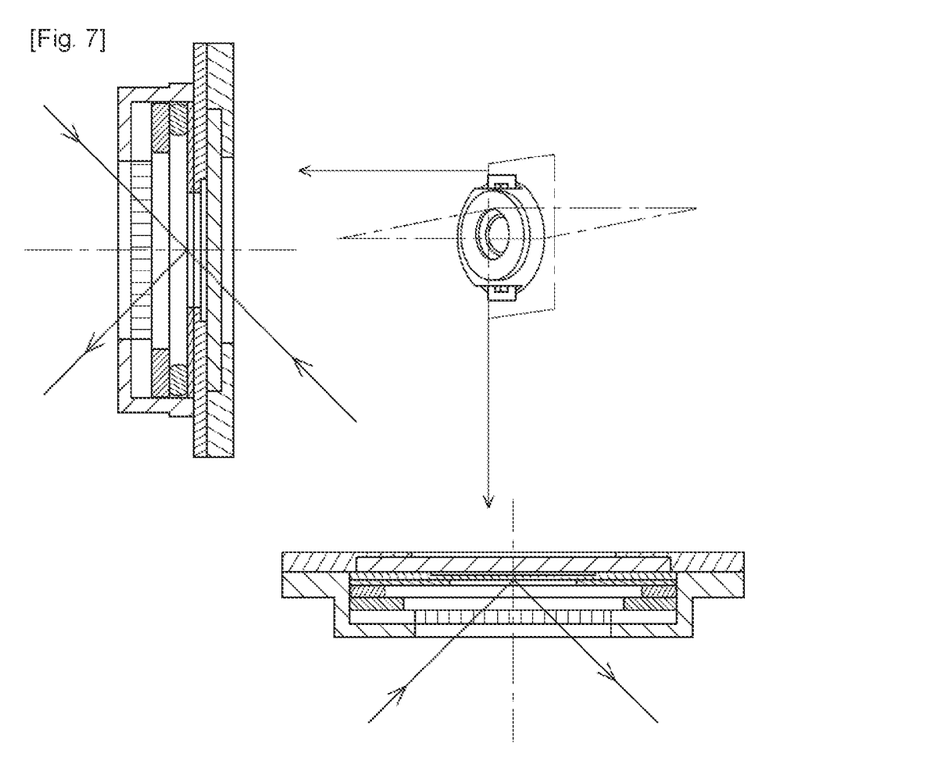
FIG. 7 illustrates different configurations of photo-triggering the charged particle generator according to the invention.

FIG. 7 illustrates different geometric configurations for the photo-triggering of the device.

It is important to be able to isolate the laser beam from the beam of electrons, which is colinear thereto. One of the ways of doing this is to send the laser LP_UV in incidence different from the normal incidence onto the photocathode PH, such that the laser beam and the beam of electrons are not colinear on the target. In addition, the slot of the anode AN is sufficiently closed so that the beam LP_UV does not pass through the system. According to an embodiment, an angle of 30 to 45° may be used with this geometry.

According to an embodiment, the firing axis of the laser impacts the target at a point and under an adjustable angle. According to an embodiment, the angle of impact is different to 90°, and preferably comprised between 30 and 45°.

According to this alternative of the Mini Gun, designed to operate in a modular manner and several modes of use are envisaged:

It may notably be chosen to attack the input face of the Mini Gun with the laser LP_UV with an angle of incidence far from the normal, with an angle close to the normal or exactly on the normal, but with a latitude of displacement of the beam along the x axis due to the anode split along x with a relative displacement parallel to the slot. It is thus possible to work with an impact on different zones of the photocathode.

It is possible to choose to work in back lighting of the sample, by attacking the output face of the Mini Gun.

Advantageously, these embodiments make it possible to increase the precision and the reliability of the analyses thanks to better separation of the beam of electrons and the beam LP_UV at the level of the sample and the detection module used for the analysis.

According to a first alternative, the Mini Gun is kept fixed and the axis of the laser beam incident on the inlet or outlet face of the Mini Gun is modified.

According to a second alternative, the laser beam is kept fixed and the position of the Mini Gun is modified with respect to the axis of the laser beam.

According to a third alternative, the impact point is placed on the photocathode at an off-centre point, and the photocathode is made to turn manually without dismantling (and without modifying the pressure in the chamber) when it is wished to modify the impact point.

In other words, the modification of the impact point of the laser can be done either by displacing the photocathode in its cradle or by modifying the direction of the laser on the slot. Advantageously, the modification of the impact point of the laser on the photocathode takes place without breaking the vacuum inside the chamber V.

In the following table may be seen the temporal resolutions obtained as a function of the cathode-anode and cathode-sample distances.

Several exemplary experiments will be described below.

The first is realised for an autonomous system where the following operations are carried out
- Pumping by pumping group (primary pump+turbo pump) up to $10^{-5}$ mbar
- Closing the coupling valve
- Decoupling the electron mini gun from the pumping group
- Transporting the electron mini gun to a user laser laboratory
- Clamping the mini chamber onto an optical table in front of the photo-triggering laser
- A mini ion pump may be connected to the mini chamber as a function of the desired duration of the experiment (up to 1 week in static vacuum is possible at present)

In this configuration, the sample to be studied must be placed in the mini chamber before it is placed under vacuum.

The second is realised with a system coupled to an existing system and the following operations are carried out:
- Transporting the electron mini gun to a user laboratory, optionally with its laser source
- Clamping the mini chamber onto an existing system, generally of larger dimension In this configuration, the sample to be studied must be placed in the chamber of greatest dimension before it is placed under vacuum, the coupling valve is on the side of the output module. The vacuum is managed by the receiving system which may be from $10^{-5}$ to $10^{-7}$ mbar, or even below. In general, the detection means are coupled to the existing system itself.

The third is done at atmospheric pressure with an autonomous system and is carried out in the following manner:
- Pumping by pumping group (primary pump+turbo pump) up to $10^{-4}$ mbar
- Closing the coupling valve
- Decoupling the electron mini gun from the pumping group
- Transporting the electron mini gun to a user laser laboratory
- Clamping the mini chamber onto an optical table in front of the photo-triggering laser.

A mini ion pump may be connected to the mini chamber as a function of the desired duration of the experiment (up to 1 week in static vacuum is possible at present). In this configuration, the voltage is from −10 kV and above in order to enable extraction to air through the membrane. The sample to be studied remains outside the mini chamber and will be placed on the ultrathin membrane at the output placed horizontally, or then vertically if it involves a vertical liquid or gaseous jet.

TABLE 2

| Cathode-anode distance | Cathode-sample distance | Ec at emission | Acceleration | Δt |
|---|---|---|---|---|
| 300 μm | 1 mm | 0 eV and 0.1 eV | 1 keV | 400 fs |
| 600 μm | 2 mm | 0 eV and 0.1 eV | 1 keV | 700 fs |
| 1 mm | 25 mm | 0 eV and 0.1 eV | 500 eV | 2.25 ps |
| 1 mm | 25 mm | 0 eV and 0.1 eV | 1 keV | 1.1 ps |
| 1 mm | 25 mm | 0 eV and 0.1 eV | 3 keV | 360 fs |
| 1.7 mm | 25 mm | 0 eV and 0.1 eV | 1 keV | 1.98 ps |
| 1.7 mm | 25 mm | 0 eV and 0.1 eV | 5 keV | 420 fs |
| 10 mm | 25 mm | 0 eV and 0.1 eV | 10 keV | 1.066 ps |
| 10 mm | 25 mm | 0 eV and 0.1 eV | 20 keV | 533 fs |
| 10 mm | 25 mm | 0 eV and 0.1 eV | 30 keV | 355 fs |

The fourth is done at atmospheric pressure with an autonomous system and is carried out in the following manner:

Pumping by pumping group (primary pump+turbo pump) up to $10^{-4}$ mbar

Closing the coupling valve

Decoupling the electron mini gun from the pumping group

Transporting the electron mini gun to a user laboratory, optionally with its laser source Clamping the mini chamber onto an experiment table, generally of larger dimension In this configuration, the voltage is from −10 kV and above in order to enable extraction to air through the membrane, the sample to be studied remains outside the mini chamber and will be placed on the ultrathin membrane at the output placed horizontally, or then vertically if it involves a vertical liquid or gaseous jet. The vacuum is generally managed by the receiving system which may be from $10^{-5}$ to $10^{-7}$ mbar, or even below. In general, the detection means are coupled to the receiving system itself.

The invention claimed is:

1. A pulsed generator of electrically charged particles comprising:
   a vacuum chamber, and
   a pulsed light source that is a laser source configured to produce light pulses with a repetition rate greater than 80 MHz;
   wherein:
   the vacuum chamber is configured to maintain an internal operating pressure comprised between $10^{-6}$ mbar and atmospheric pressure;
   the vacuum chamber is configured to accommodate a photocathode and an anode, the photocathode and the anode being separated by an adjustable distance less than or equal to 30 mm;
   the vacuum chamber comprises an optical window enabling pulsed light to reach firstly a rear face of the photocathode;
   the anode is arranged downstream of the photocathode and has an orifice suitable for the passage of electrically charged particles; said pulsed generator of electrically charged particles comprises a device configured to apply a difference in potential between the photocathode and the anode, said difference in potential being configured to accelerate the charged particles.

2. The pulsed generator of electrically charged particles according to claim 1, wherein the distance between the photocathode and the anode is less than 10 mm.

3. The pulsed generator of electrically charged particles according to claim 2, wherein the distance between the photocathode and the anode is less than 2 mm.

4. The pulsed generator of electrically charged particles according to claim 3, wherein the bias voltage of the photocathode is less than or equal in absolute value to 30 kV so as to obtain packets of electrically charged particles, each packet having a temporal duration less than or equal to 5 ps.

5. An analysis method for analysing a sample utilizing a pulsed generator of charged particles according to claim 4, the method comprising:
   placing the sample in the vacuum chamber,
   creating a vacuum in the vacuum chamber between $10^{-6}$ mbar and atmospheric pressure;
   placing the pulsed generator of charged particles on a table in front of the pulsed light source; and
   positioning a diagnostics module for the analysis of the sample in position downstream of the sample.

6. The analysis method according to claim 5, wherein the diagnostic module is placed inside the vacuum chamber.

7. The analysis method according to claim 5, wherein the diagnostic module is placed outside the vacuum chamber.

8. A method for analysing a sample utilizing a pulsed generator of charged particles according to claim 4, the method comprising:
   creating a vacuum in the vacuum chamber between $10^{-6}$ mbar and atmospheric pressure;
   placing the pulsed generator of charged particles on a table in front of the pulsed light source;
   placing the sample in position downstream of the vacuum chamber, positioning a diagnostics module for the analysis of the sample in position downstream of the sample.

9. The pulsed generator of electrically charged particles according to claim 1, wherein the pulsed light source produces light pulses having a temporal duration less than or equal to 5 ps.

10. The pulsed generator of electrically charged particles according to claim 1, further comprising a breakdown detector.

11. The pulsed generator of electrically charged particles according to claim 10, wherein the breakdown detector is placed near to the anode and comprises:
    a substrate made of insulating material with high dielectric constant;
    a ring and a stem made of conductive material taken to the same potential as the anode;
    a stem made of conductive material, said stem being movable and being able to come closer to the conductive ring.

12. The pulsed generator of electrically charged particles according to claim 10, wherein the breakdown detector is configured to determine the electrical breakdown pressure under the bias voltage of the photocathode used.

13. The pulsed generator of electrically charged particles according to claim 1, wherein said vacuum chamber comprises a sample to be analysed, a distance d1 between the anode and the sample to be analysed being such that $0 < d1 \leq 0.7$ mm.

14. The pulsed generator of electrically charged particles according to claim 13, further comprising a diagnostics module for the analysis of the sample.

15. The pulsed generator of electrically charged particles according to claim 14, wherein the diagnostics module is arranged at a distance d2 from the sample such that $0 < d2 \leq 60$ mm.

16. The pulsed generator of electrically charged particles according to claim 1, wherein said vacuum chamber further comprises another window, said other window being transparent to the charged particles.

17. The pulsed generator of electrically charged particles according to claim 1, further comprising a sample to be analysed placed outside the vacuum chamber.

18. The pulsed generator of electrically charged particles according to claim 1, wherein the photocathode comprises a nanometric metal stack on a substrate of thin optical blade type.

19. The pulsed generator of electrically charged particles according to claim 1, wherein the orifice of the anode is anisotropic and has a first characteristic dimension and a second characteristic dimension, the second characteristic dimension being at least two times greater than the first characteristic dimension.

20. The pulsed generator of electrically charged particles according to claim 19, wherein the anisotropic orifice of the anode is slot shaped.

21. The pulsed generator of electrically charged particles according to claim 20, wherein the slot comprises at least two parallel edges, the two parallel edges being at two different electrical potentials.

22. The pulsed generator of electrically charged particles according to claim 21, further comprising another diagnostics module for the determination of a temporal duration of packets of electrically charged particles.

\* \* \* \* \*